United States Patent [19]

Cielo

[11] 4,400,056

[45] Aug. 23, 1983

[54] EVANESCENT-WAVE FIBER REFLECTOR

[75] Inventor: Paolo G. Cielo, Montreal, Canada

[73] Assignee: Her Majesty the Queen as represented by the Minister of National Defence of her Majesty's Canadian Government, Montreal, Canada

[21] Appl. No.: 244,682

[22] Filed: Mar. 17, 1981

[30] Foreign Application Priority Data

Jul. 9, 1980 [CA] Canada ............................ 356606

[51] Int. Cl.³ .............................................. G02B 5/14
[52] U.S. Cl. ............................. 350/96.19; 350/96.30
[58] Field of Search .......................... 350/96.30, 96.19

[56] References Cited

U.S. PATENT DOCUMENTS 3,891,302  6/1975  Dabby ............................. 350/96.19
4,176,911 12/1979  Marcatili, et al. ............... 350/96.30

FOREIGN PATENT DOCUMENTS 55-110207 8/1980 Japan ................................ 350/96.19

Primary Examiner—David K. Moore
Attorney, Agent, or Firm—Larson and Taylor

[57] ABSTRACT

A tunable optical fiber reflector is described, together with a method of making the same. A length of optical fiber has a core of a first light transmitting material, and a cladding of a second light transmitting material covering the core. The cladding is etched away to a predetermined thickness over a portion of the fiber. A layer of photoresist material is applied either to the etched away portion of the fiber or to a thin metal blade, i.e., mask, and then exposed to beams of light which optically interfere and generate a standing wave pattern in said material. The photoresist material is then developed to fix said wave pattern therein. An optical discontinuity is formed in one of the core and cladding by that fixed wave pattern, said discontinuity representing a quasi-periodical fluctuation in the refractive index and causing evanescent waves in the cladding to be reflected. Such discontinuity forms a distributed-feedback reflector. In one method, the fiber core in the etched portion is bombarded under a vacuum with a beam of ions passed through openings having said standing wave pattern, thus producing quasi-periodical fluctuations in the refractive index of the core. More preferably, the photoresist material is coated on the etched portion of the fiber, and counter-propagating light beams are coupled into opposite ends of the fiber. These beams expose the photoresist material and generate the standing wave pattern therein as residual quantities of the same. The etched portion of fiber is typically filled with reinforcing material such as an epoxy. Two such reflectors in an optical fiber make up a resonator, and several resonators can be used in a hydrophone line-array.

5 Claims, 5 Drawing Figures

EVANESCENT-WAVE FIBER REFLECTOR

This invention relates to an optical fiber reflector. More particularly, the invention relates to a tunable distributed-feedback reflector made in a length of optical fiber.

BACKGROUND AND DESCRIPTION OF THE PRIOR ART

Some forms of optical fiber reflectors have previously been proposed. These were obtained by producing a quasi-periodical fluctuation in the refractive index of the core of the optical fiber. This fluctuation was achieved by exposing a photosensitive Ge-doped fiber core to a standing wave pattern resulting from the superposition of counter-propagating beams of light. Light from a high power Argon-ion laser is coupled into opposite ends of the fiber. The light propagates in opposite directions and produces a standing wave pattern in the region of the fiber where the two counter-propagating light beams have an almost equal difference in path length. The wave pattern extends approximately through a length DL. This length DL is related to the spectral bandwidth Df/f of the laser, and to the wavelength $\lambda$ of light in the fiber by the relationship:

$$DL = \frac{\lambda f}{Df} \quad (1)$$

By exposing the fiber to the light beams for a few moments in an environment where the fiber is held mechanically and thermally stable, the refractive index of that fiber in the region of interfering light beams is permanently modulated. It is the change in refractive index which produces a distributed-feedback reflection of a portion of an incident beam of light. In practice, it is believed that a slight amount of reflection of a light beam occurs at each fluctuation in refractive index, i.e., optical discontinuity. These give rise to a series of reflected beams delayed with respect to one another by multiples of the wavelength. These reflections add together, in phase, giving rise to a strong reflected beam.

This approach to making optical fiber reflectors does, however, face a number of problems. For example, if the fiber core is photosensitive, it too will be exposed by beams of light transmitted through it during normal use. This exposure will tend to erase the mudulations in refractive index over a period of time, to eventually destroying the usefulness of the reflector.

Moreover, the reflector is effective only at the same wavelength as that of the exposing beam. Hence, the longer the region of interference DL, the higher is the precision needed for matching the wavelengths of the exposing beam and transmitted beam. In the above example, an interference region DL of at least 1.0 meters long is required. Otherwise, an insufficient number of optical discontinuities result, i.e. fluctuations in refractive index, together with low overall reflectivity. From the equation (1) above, a precision in frequency Df/f of the order of $10^{-6}$ is required in that case.

Another difficulty that may be encountered is that of detuning of such highly frequency selective reflectors, due to mechanical or thermal perturbations. Detuning can arise from varying of the spatial period of the region of modulated index of refraction. For example, a reflector of one (1) meter in length can be detuned by a temperature difference as small as 0.05° C., assuming a coefficient of thermal expansion of $10^{+5}$ per degree. Such sensitivity to environmental conditions is incompatible with many possible applications of optical fiber reflectors, for instance, in underwater sonar sensing.

BRIEF SUMMARY OF THE INVENTION

The present invention will overcome the disadvantages noted above with respect to prior art optical fiber reflectors. This invention makes use of the presence in the cladding of an optical fiber of an evanescent wave when light is being transmitted along that fiber. Thus, the present invention involves the formation of permanent optical discontinuities in the form of quasi-periodical fluctuations in the index of refraction of at least one of the cladding and core of an optical fiber. Accordingly, the problem of possible erasure of such discontinuities is eliminated. Further, the length of an optical fiber reflector envisaged by this invention can be made arbitrarily small. In consequence the bandwidth of the filter can be arbitrarily large.

Thus, it is an object of this invention to provide an improved optical fiber reflector. Accordingly, there is provided by this invention a tunable optical fiber reflector, comprising a length of optical fiber having a longitudinal axis, a core of a first light transmitting material; and a cladding covering the core and being of a second light transmitting material, the cladding being etched away to a selected thickness over a portion thereof, there being formed deliberately in at least one of the cladding and core an optical discontinuity in a preselected pattern, such discontinuity forming a distributed-feedback reflector. In one preferred embodiment, a quasi-periodical fluctuation in the refractive index is provided by permanently including in the cladding at least one inclusion of another light transmitting material. Still more preferably, the preselected pattern is in the form of a standing wave having a series of planes perpendicular to the longitudinal axis of the fiber, the planes being separated from another by a distance nearly equal to one half a wavelength, and extending through the core into a portion of the cladding.

By another aspect of this invention there is also provided a method for making an optical fiber reflector from a length of optical fiber having a longitudinal axis, a core of a first light transmitting material and a cladding over the core of a second light transmitting material; the method comprising: etching away a predetermined thickness of the cladding over a portion of the optical fiber; applying a layer of photoresist material to one of the etched portion of the fiber and a thin metal blade positioned to overlie the etched portion of the fiber; exposing the photoresist material to counter-propagating beams of light which will interfere to generate a standing wave pattern; developing the exposed photoresist material to fix the wave pattern therein; and using the fixed wave pattern to form an optical discontinuity of a selected form in the optical fiber, the discontinuity functioning as the distributed-feedback reflector. More preferably, the layer of photoresist material is applied to the fiber core, and exposing the material is effected by coupling counter-propagating light beams into the optical fiber from opposite ends thereof, whereby the beams generate a standing wave pattern having a series of planes perpendicular to the longitudinal axis of the fiber. In a still more preferred method, residual amounts of the photoresist material are left on the fiber in a quasi-periodical pattern, and etched portion of the fiber is filled with reinforcing material such as epoxy.

These and other features of this invention will become more apparent from the detailed description below. That description should be read in conjunction with the detailed drawings below.

DETAILED DESCRIPTION OF THE PREFERRED EMBODIMENTS

Figure 1:
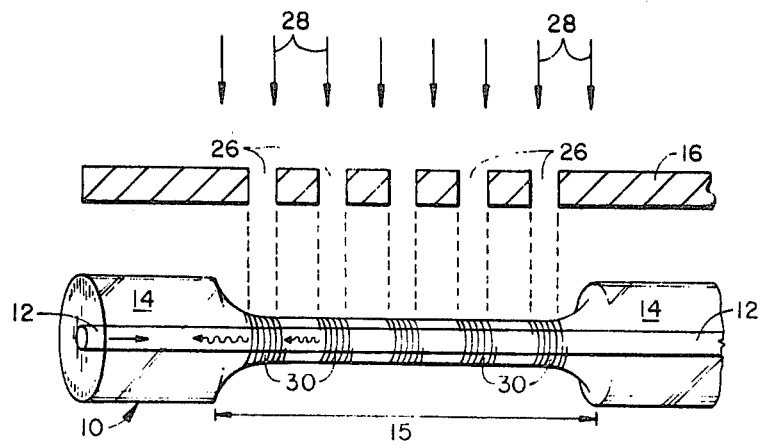
FIGS. 1 and 2 are schematic drawings which show an optical fiber reflector as envisaged herein, and illustrate one method of making the same.
Figure 2:
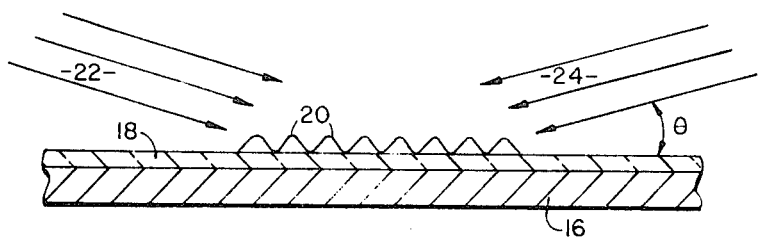

With reference to FIGS. 1 and 2, there is shown overall at 10 an optical fiber reflector as envisaged by this invention. This reflector 10 is made from a length of optical fiber having a core 12 of a first light transmitting material and a cladding 14, over the core, of a second light transmitting material. A portion 15 of the cladding has been etched away to a predetermined thickness. In making an optical fiber reflector of the kind envisaged herein, in one method a thin metal blade or mask 16 is used. The blade 16 is initially coated with a photoresist material 18 (FIG. 2), and then exposed to an interference pattern, indicated by the wavy lines at 20. The interference pattern 20 is produced by the superposition of two incident light beams 22 and 24. These light beams 22, 24 have a very low angle of incidence $\theta$, typically in the range of about 5°–15°, and preferably about 10°.

The photoresist material of the layer 18 is then developed and fixed photographically, leaving behind a line pattern corresponding to the interference pattern 20. The thin metal blade 16 is then etched through the line pattern in layer 18, to produce the openings 26 in blade 16, again corresponding in spacing and positioning thereof to the interference pattern generated earlier by light beams 22, 24. Subsequently the etched mask 16 is positioned over the etched portion 15 of the optical fiber, and under a vacuum, the core 12 is bombarded with ions passing through openings 26 in the metal blade or mask 16. The ion bombardment is illustrated schematically by arrows 28. This ion bombardment causes a series of variations 30 in the index of refraction of the fiber core 12. These variations or fluctuations 30 are quasi-periodical, being spaced apart in correspondence to the openings 26 in mask 16, which in turn corresponded to the interference pattern of the light beams 22 and 24. It is to be noted that the spatial positioning of the variations 30, or optical discontinuities as they can also be described, will be determined by the wavelength (frequency) and by the angle of incidence $\theta$ of the incident exposing light beam. A portion of the light being transmitted is reflected back from these optical discontinuities.

To digress momentarily, it is noted that the core 12 of the optical fiber has a refractive index $n_c$, surrounded by the cladding 14 with refractive index $n_{cl}$. The difference $n_c - n_{cl}$ usually is of the order of 0.01. Practioners in this art will recognize that light coupled into a single-mode optical fiber will have a bell-shaped intensity (I) distribution. Moreover, an appreciable fraction of the coupled light is transmitted through the cladding, i.e., the evanescent wave. In making the fiber reflector described herein, the cladding 14 is preliminarily etched away to a predetermined thickness using a chemical etchant such as HF: NH$_4$F. The rate of etching will, of course, depend upon the concentration of the etchant, but typically is in the order of a few micrometers per minute.

The photoresist material of layer 18 should have a refractive index similar to that of the cladding 14 so as not to perturb the effective refractive index n of the fiber 10 during exposure. The precision required in matching the refractive indices of the two materials depends on the rate of change of the refractive index with the cladding index, that is:

$$\Delta n = \frac{\partial n}{\partial n_{cl}} \Delta n_{cl} = \frac{\partial n}{\partial v} \cdot \frac{\partial v}{\partial n_{cl}} \Delta n_{cl} = \quad (2)$$

$$\approx 10^{-3} \frac{2\pi a}{\lambda} \cdot \frac{1}{\sqrt{n_c^2 - n_{cl}^2}} \cdot \Delta n_{cl} \approx 0.1 \, \Delta n_{cl}$$

assuming a fiber radius, a = 1.5 $\mu$m; $\lambda$ = 0.5 $\mu$m, $n_c$ = 1.5, and $n_{cl}$ = 1.49. For a reflector of 1 mm length, the required precison of index-matching is thus in the order of 1%. Further discussion of the details of index matching can be found in the book, *Fundamentals of Optical Fiber Communications*, Academic Press 1976, in the chapter "Optical Fiber Waveguides" by D. B. Keck.

Figure 3:
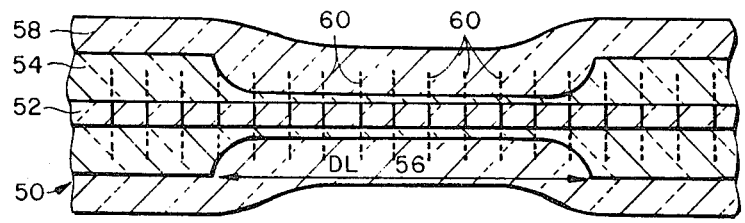
FIGS. 3 and 4 are also schematic drawings of another form of optical fiber reflector envisaged herein, and indicative of the method of making the same.
Figure 4:
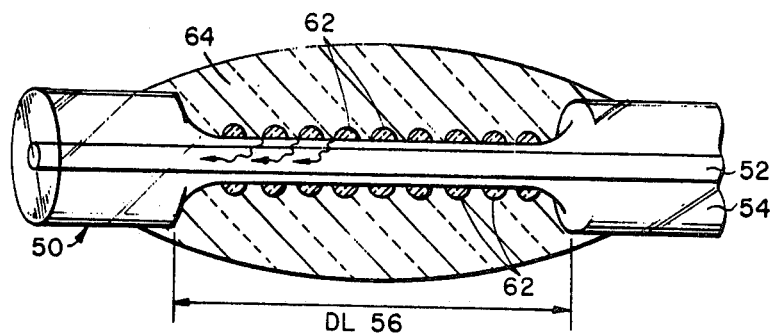

Returning now to the present invention, FIGS. 3 and 4 illustrate schematically a method for making a more preferred form of fiber reflector envisaged herein. Thus, a section of optical fiber 50 is seen to comprise a core 52 surrounded by cladding 54. The cladding is etched away at over a region DL 56 to leave only a small thickness remaining. A layer 58 of a photoresist material is applied over the section of fiber 50, and the latter then coupled at opposite ends thereof (not shown) to two counter-propagating light beams of the same wavelength. These two beams generate a standing wave pattern, indicated by line 60, which may actually overlap, i.e., extend beyond the region DL. The standing wave pattern originates from the interference of the two light beams with one another. Moreover, the pattern has the form of a series of planes extending perpendicular to the axis of the fiber 50. These planes are separated one from another by a distance nearly equal to one half wavelength of the light beams from which they originate. These planes extend through at least the core 52 and into the cladding 54. At the same time these planes, within the etched region 56 will also extend into the layer 58 of photoresist material, causing exposure of the same. The photoresist material is then developed and fixed photographically, leaving residual quantities 62 of that material within etched region 56. These residual quantities 62 are spaced uniformaly apart, in correspondence to the planes making up the wave pattern 60. In other words, the residual quantities 62 are in a quasi-periodical pattern. In practice, a 1 mW light source with an exposure time of the order of 1 msec is sufficient to expose commercial photoresists.

Preferably, the etched portion 56 is reinforced with a filler 64, such as an epoxy or other such material. The filler material 64 should have an index of refraction identical to that of the cladding 54.

It is noted that the ratio between reflected and incident amplitude at the filler/photoresist interface is in the order of $$\frac{n_c - n_{cl}}{2n_c}$$

with an index difference of 0.5% i.e., $n_c-n_{cl}=0.005$ we obtain an overall filter reflectivity of the order of 50% for a 1.0 mm-long reflector, if about one half of the light transmitted through the fiber propagates through the cladding. The reflectivity also depends on the depth of etching of the fiber cladding.

FIGS. 1 and 4 illustrate reflectors in which a small thickness of cladding was left over the core. The thickness of such residual cladding strongly affects the reflectivity of the reflector. The cladding may be removed entirely, over the region DL (Nos. 15 and 56 in FIGS. 1 and 4) if higher reflectivity is required. Further, still higher reflectivity may be obtained by slightly etching the core itself, say, through the mask 16 of FIGS. 1 and 2, before applying the filler 64 as in FIG. 4. In that situation a quasi-periodical modulation of the core diameter provides reflections at the core discontinuities. That would be so even if the photoresist material is subsequently dissolved and the fiber cladding reconstituted by filling with a material of refractive index identical to that of the cladding.

Returning to the question of detuning of the reflector due to temperature, variations in temperature of up to 50° C. can be absorbed as long as the variation in length of the optical fiber of the reflector does not exceed one half wave length of the exposing light. If the coefficient of thermal expansion is $10^{-5}$, then a limit of 1 mm is established as the maximum length DL of the reflector envisaged herein.

Figure 5:
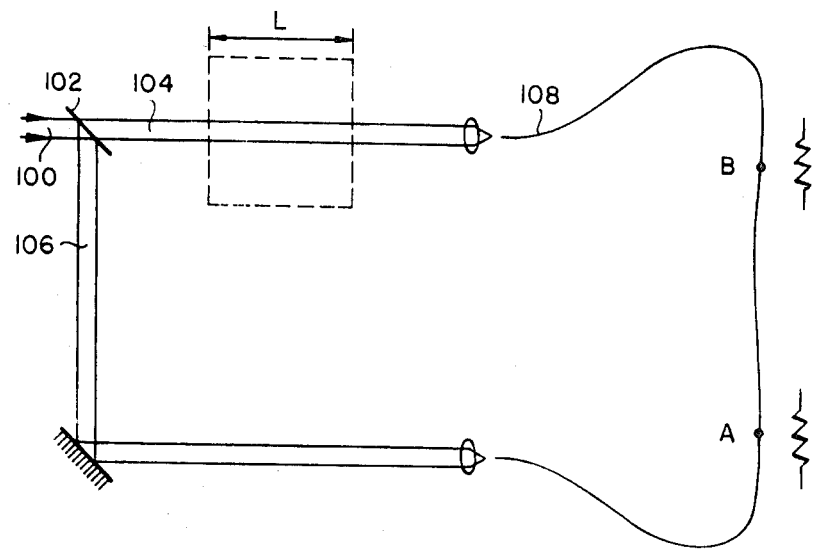
FIG. 5 is a schematic drawing to illustrate an optical fiber line array which uses at least two reflectors of the type described herein.

There are certain applications, as in the manufacture of a fiber-optic hydrophone where it is necessary to determine the distance between two reflectors, i.e., the phase difference between the beams reflected from two reflectors, with a precision of 1 mm or less. FIG. 5 herein shows one method for making such a determination of accurate spacing, simply. In that drawing figure, then, light from a moderately coherent source is split and coupled into the opposite ends of a length of optical fiber. Such a light beam is shown at 100, with a conventional beam splitter 102 generating two couunterpropagating beams 104 and 106. The optical fiber is shown at 108, and had been etched previously as described in relation to FIGS 1-4, to remove cladding, and then coated with a photoresist material. That was done over a long length of the fiber 108. The interference pattern produced by the counter-propagating light beams 104, 106 results in a quasi-periodical standing wave pattern of a length equal to the coherence length of the light beams. This occurs in the vicinity of the point marked A. The point A is at a location where the counter propagating light beams 104, 106 have the same phase delay and have travelled the same distance from beam splitter 102. The photoresist material covering the fiber 108 is exposed to the standing wave pattern of the interfering light beams, is developed and fixed photographically, thus forming a passive reflector at A of the type already described above.

A glass plate or rod 110 is inserted as a supplementary phase delay into, say, the path of the light beam 104. The plate or rod 110 has a length L. If the glass of plate or rod 110 has a refractive index n, the corresponding path increase in one of the light beams 104 (or 106) would be (n-1)L. In that instance the new location of equal path length will be moved, for example, to location B. A second passive reflector of the type described above is produced in the fiber 108 at that location B. The two reflectors at A and B will thus form a cavity resonator of length which is exactly reproducible.

It will be evident that the same procedure or technique can be used to produce another pair of passive reflectors at other locations along the fiber 108. In that way, a series of cavity resonators can be built up at predetermined locations, and a preselected lengths.

Other applications, such as a wavelength-multiplexed linearray for sonar beam-forming require a multiplicity of fiber resonators, each operating at a certain wavelength and ompletely transparent to the wavelengths of operation of the other resonators. Each of these resonators can be obtained by the method described in the previous paragraphs, provided that each pair of reflectors is obtained using a light beam of different frequency. As the method described here does not require high power laser beams, light of different frequencies can be obtained from the same largebandwidth source, such as an LED, by selecting different portions of its spectum using a prism or other dispersing device.

The embodiments of the invention in which an exclusive property or privilege is claimed are defined as follows:

1. A method for making an optical fiber reflector from a length of optical fiber having a longitudinal axis, a core of a first light transmitting material and a cladding over said core of a second light transmitting material; said method comprising;
   (a) etching away a predetermined thickness of the cladding over a portion of the optical fiber;
   (b) applying a layer of photoresist material to the etched portion of the fiber;
   (c) coupling counter-propagating light beams into said optical fiber at opposite ends thereof so that the counter-propagating light beams interfere to generate a standing wave pattern to which the photoresist material is exposed:
   (d) developing the exposed photoresist material to fix said wave pattern therein; and
   (e) using the fixed wave pattern to form an optical discontinuity of a selected form in said optical fiber, said discontinuity functioning as the distributed-feedback reflector.

2. The method defined in claim 1, wherein said layer of photoresist material is applied to the fiber core, and said beams generate a standing wave pattern having a series of planes perpendicular to the longitudinal axis of said fiber.

3. The method defined in claim 1, wherein said light beams generate a standing wave sufficiently concentrated to provide series of planes perpendicular to the longitudinal axis of said fiber which extend through at least the core and partially into the cladding.

4. The method defined in claim 2 or 3, wherein residual amounts of the photoresist material are left on the fiber in a quasi-periodical pattern.

5. The method defined in claim 2 or 3, wherein residual amounts of the photoresist material are left on the fiber in a quasi-periodical pattern, and the etched portion of said fiber is filled with a reinforcing material such as epoxy.

* * * * *